US009504171B2

(12) United States Patent
Lau et al.

(10) Patent No.: US 9,504,171 B2
(45) Date of Patent: Nov. 22, 2016

(54) PORTABLE POWER SUPPLY

(71) Applicants: Vincent W. S. Lau, Kowloon (HK); Lei Zheng, Kowloon (HK)

(72) Inventors: Vincent W. S. Lau, Kowloon (HK); Lei Zheng, Kowloon (HK)

(73) Assignee: Sun Pleasure Company Limited, Hong Kong (HK)

( * ) Notice: Subject to any disclaimer, the term of this patent is extended or adjusted under 35 U.S.C. 154(b) by 446 days.

(21) Appl. No.: 13/774,880

(22) Filed: Feb. 22, 2013

(65) Prior Publication Data
US 2013/0271906 A1 Oct. 17, 2013

(51) Int. Cl.
*H02J 7/00* (2006.01)
*H05K 5/00* (2006.01)
*G06F 1/18* (2006.01)
*G06F 1/26* (2006.01)
*H01M 2/10* (2006.01)

(52) U.S. Cl.
CPC .............. *H05K 5/0086* (2013.01); *G06F 1/18* (2013.01); *G06F 1/263* (2013.01); *H01M 2/1022* (2013.01); *H02J 7/0054* (2013.01); *H02J 2007/0062* (2013.01)

(58) Field of Classification Search
USPC .......................................... 320/113
See application file for complete search history.

(56) References Cited

U.S. PATENT DOCUMENTS

| 4,918,632 A * | 4/1990 | York .................. G06F 1/1626 361/679.09 |
| 6,046,571 A * | 4/2000 | Bovio et al. ................ 320/113 |
| 2006/0103973 A1 * | 5/2006 | Turner ............. G11B 15/67555 360/94 |
| 2012/0052743 A1 * | 3/2012 | Li et al. ...................... 439/660 |

OTHER PUBLICATIONS

Lenovo United States, "ThinkPad X200 UltraBase offers portable expansion for X200 Series ultraportables and tablets," Aug. 5, 2008.*

* cited by examiner

*Primary Examiner* — Eric Lee
(74) *Attorney, Agent, or Firm* — Raymond Sun

(57) ABSTRACT

A power supply has a generally rectangular housing that has a length of about 11 inches and a width of about 8.5 inches, with a thickness of less than 5.2 cm. A rechargeable battery is housed inside the housing, and a power bay is provided on the housing and coupled to the battery inside the housing.

2 Claims, 7 Drawing Sheets

PORTABLE POWER SUPPLY

BACKGROUND OF THE INVENTION

1. Field of the Invention

The present invention relates generally to electronic devices, and in particular, to a portable power supply that is made of a high-strength light alloy material, and which is sized and configured to be retained in a loose-leaf notebook or folder.

2. Description of the Prior Art

In work and daily life, many people (such as students and business people) need to use mobile electronic devices, and also need to carry a mobile power supply. The mobile power supply is usually a portable charger where the features of power supply and charging are integrated, and it is capable of charging anytime and anywhere, and offers standby charging of digital devices such as a mobile phone. Normally, a lithium cell core or similar dry cell is used as an electrical storage unit. It is normally loaded with multiple power supply adaptors, is usually characterized by being of large capacity, multipurpose, small volume, long service life and being safe and reliable, and it is a functional product which is capable of providing power supply anytime and anywhere, or in standby charging of multiple digital products such as a mobile phone, MP3 players, MP4 players, mobile phones, PDAs, pocket computers, handheld video game consoles and notebook computers.

Most conventional low-power solutions are normally provided in a column shape or box shape. A column-shaped battery is normally one that uses a number of lithium ion batteries as the power supply. A box-shape battery is normally one that uses one or two polymer lithium cells as the power supply. A USB interface is used for charging and discharging. Some are loaded with a power supply switch and a battery indicator. These batteries enjoy some advantages, such as that they are simple, small in volume, easy to carry, and can meet the requirement of regular devices for electrical power. However, they also suffer from a number of disadvantages in that they are normally thick, which is not good for portability as a whole, and their capacity and output power are relatively low, as the capacity is usually only 2000 mAH, while the output power is usually no greater than 5 V, 1 A.

A high-power solution is normally provided as a relatively large rectangular box in shape. It normally uses a number of polymer lithium cells or a number of lithium ion batteries in parallel or series connection as the power supply. A designated high-power power supply is used as the power supply for charging. It is loaded with a power supply output switch and battery indicator. Most of them can support a number of regular USB power supply outputs at the same time. Some can support the power supply for notebook computers. One advantage of such high power solutions is that they have a high output power, which can basically provide the power supply for all common mobile devices. With a high capacity, the device can meet the long-term application of an external device. A designated high-power power supply can be used as the power supply for charging, to ensure that the charging time is in an even more acceptable range. The disadvantages of such high power solutions are that they are heavier, bigger and thicker, so they are not convenient to carry.

In summary, existing power supplies have a number of deficiencies. They do not have a good portable design, and usually need to have various special containers or carrying tools, in light of various requirements of the shape and size of the product.

In addition to power supplies, most people also tend to carry loose-leaf notebooks. Therefore, many users simultaneously carry a loose-leaf notebook and a separate electronic device such as a mobile power supply, which can be very inconvenient. In this regard, existing notebooks, folders, and brochures mostly consist of only a front cover and back cover, with loose-leaf paper loaded in between the covers. With the development of society, people always need a large number of data in work and study, and to meet their needs, people have to carry heavy briefcases, backpacks or schoolbags, which can be very inconvenient.

In light of the above, there is always a need to lighten the load being carried by people in today's technology and information-laden world, and a need for an improved power supply that can be carried around conveniently by students and business professionals alike.

SUMMARY OF THE DISCLOSURE

To accomplish the objectives set forth above, the present invention provides a power supply, having a generally rectangular housing that has a length of about 11 inches and a width of about 8.5 inches, with a thickness of less than 5.2 cm. A rechargeable battery is housed inside the housing, and a power bay is provided on the housing and coupled to the battery inside the housing.

In one embodiment of the present invention, a USB port can be provided on the housing, with the USB port being adapted to be opened or raised to accommodate a USB plug, and to be closed or retracted when not in use.

DETAILED DESCRIPTION OF THE PREFERRED EMBODIMENTS

The following detailed description is of the best presently contemplated modes of carrying out the invention. This description is not to be taken in a limiting sense, but is made merely for the purpose of illustrating general principles of embodiments of the invention. The scope of the invention is best defined by the appended claims.

Figure 1:
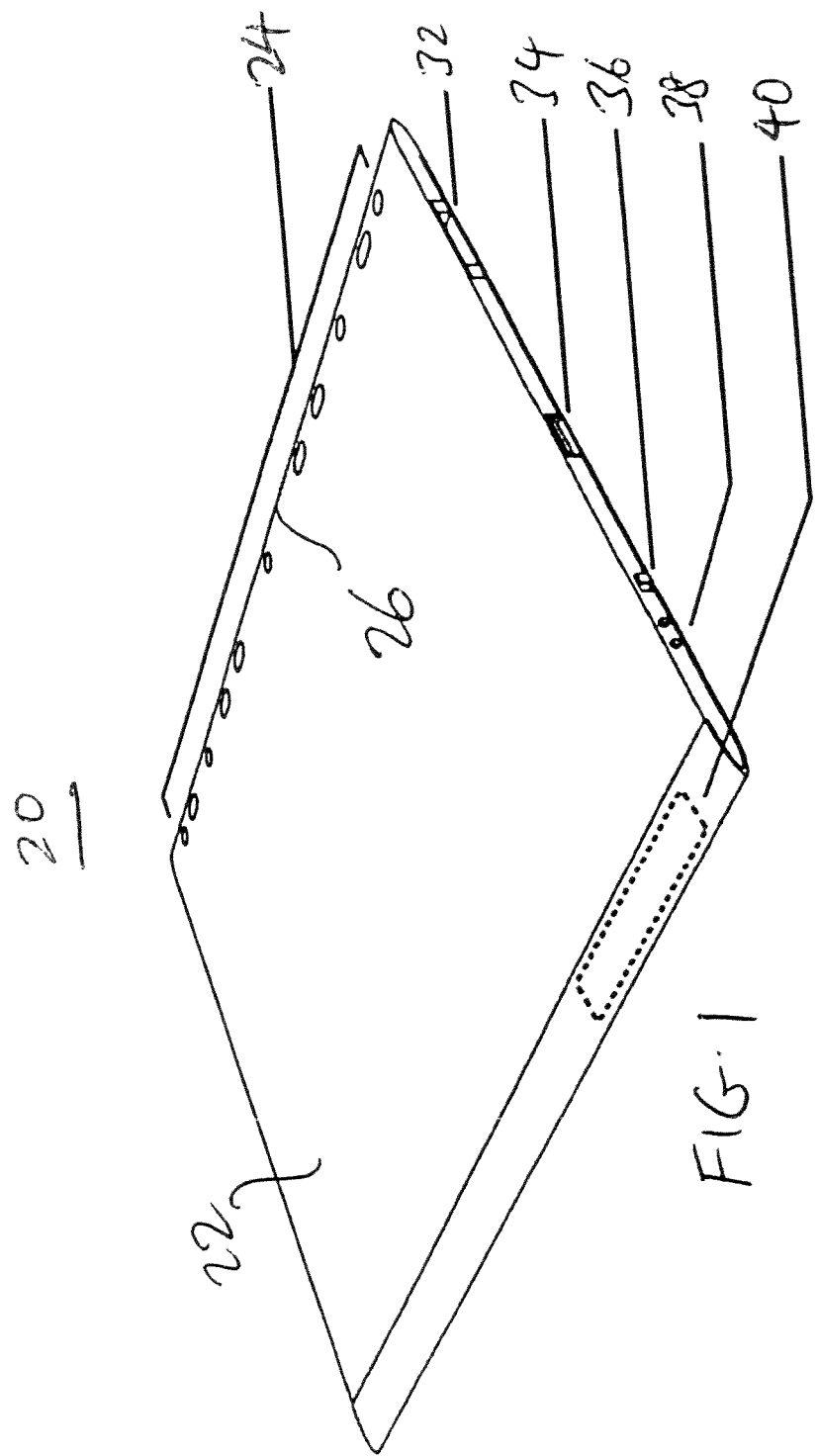
FIG. 1 is a perspective view of a portable power supply according to one embodiment of the present invention.

FIG. 1 illustrates an embodiment of a portable power supply 20 according to the present invention. The power supply 20 can be provided in the shape of any notebook or binder that is generally available in the marketplace. For example, the power supply 20 can be generally rectangular and sized to fit inside a conventional folder or notebook. As a result, the housing 22 of the power supply 20 can be about 8.5 inches in width and 11 inches in length for use in the United States. For those countries that use A4 paper, the power supply 20 can be about 21 cm in width and 29.7 cm in length (A4 size). The housing 22 is designed such that it has a flattened configuration, so as to reduce its thickness as much as possible. In a preferred embodiment, the thickness if the housing 22 does not exceed 5.2 cm, which means that the thickness of the housing 22 is less than the thickness profile of a USB plug. The housing 22 is made of a high-strength light alloy material (such as alloy aluminum).

Figure 2:
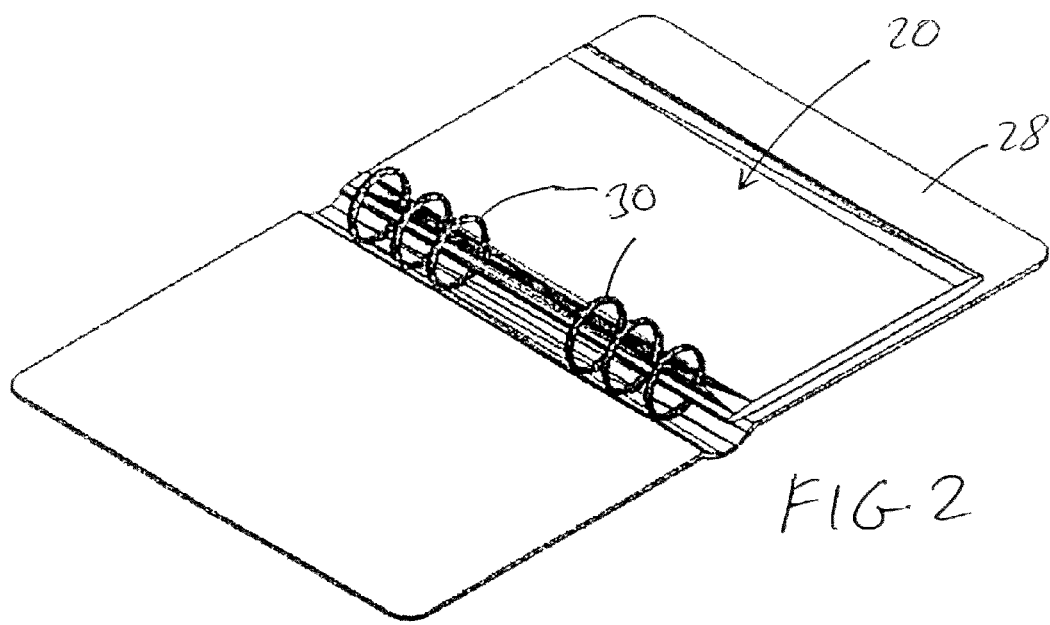
FIG. 2 is a perspective view of the power supply of FIG. 1 retained inside a conventional six-ring notebook.

A plurality of through-holes 24 are provided along one of the long (11-inch) sides 26. These holes 24 are positioned at the locations, and have the same sizes as, the rings on a conventional notebook or binder or folder. For example, the holes 24 can be located and sized so that the rings of a conventional 3-ring binder can be inserted therethrough. As another example, as shown in FIGS. 1 and 2, the power supply 20 can have eleven holes 24, and be fitted inside a generic notebook 28 that has a plurality of loose-leaf rings 30. As a result, the power supply 20 can be retained inside a conventional binder or folder or notebook.

As an alternative, the plurality of through-holes 24 can also be provided along one of the short (8.5 inch) sides.

Figure 3:
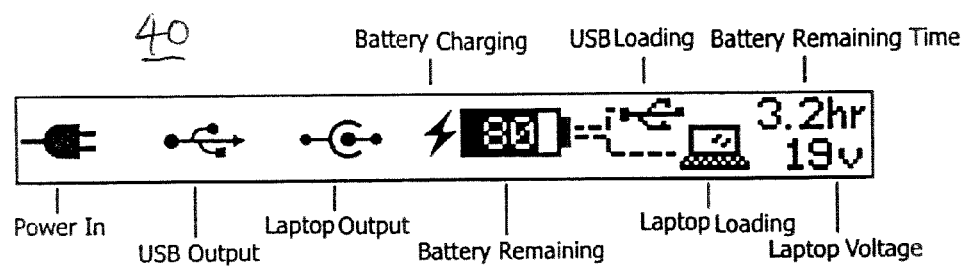
FIG. 3 illustrates a display that can be used with the power supply of FIG. 1.

Referring back to FIG. 1, the power supply 20 includes a power bay 32, a USB port 34, a laptop activation switch 36, selection buttons 38, and a display 40. FIG. 3 illustrates non-limiting examples of the items that can be displayed on the display 40.

Figure 4:
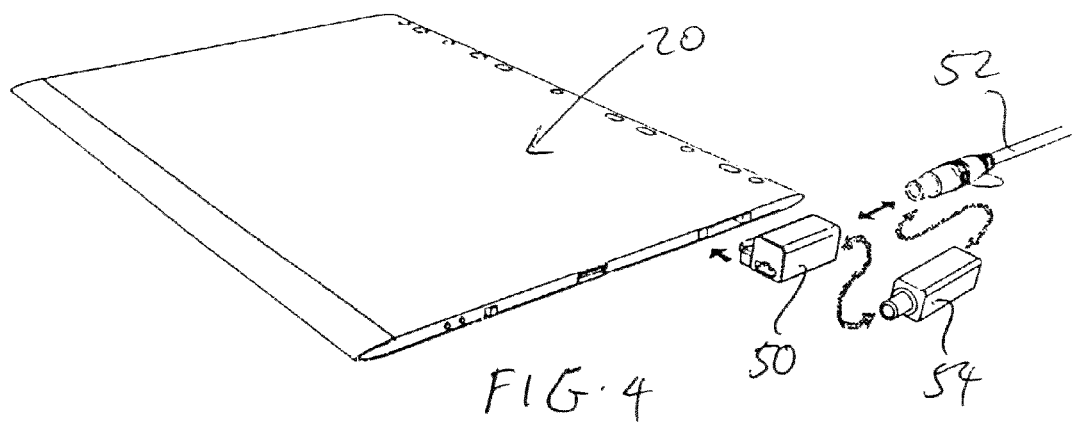
FIG. 4 illustrates how the power supply of FIG. 1 can be charged.

FIG. 4 illustrates how the power supply 20 can be charged. A power port 50 (which can be provided together with the power supply 20) can be plugged into the power bay 32, and then a power cord 52 can be used to connect the power port 50 and an electrical outlet (not shown) to charge the power supply 20. The power cord 50 can be a customized power cord 52 provided with the power supply 20, or it can be the power cord or adaptor for a laptop. A port converter 54 (which can be provided together with the power supply 20) can be used to adapt the power port 50 to the power cord 52.

Figure 5:
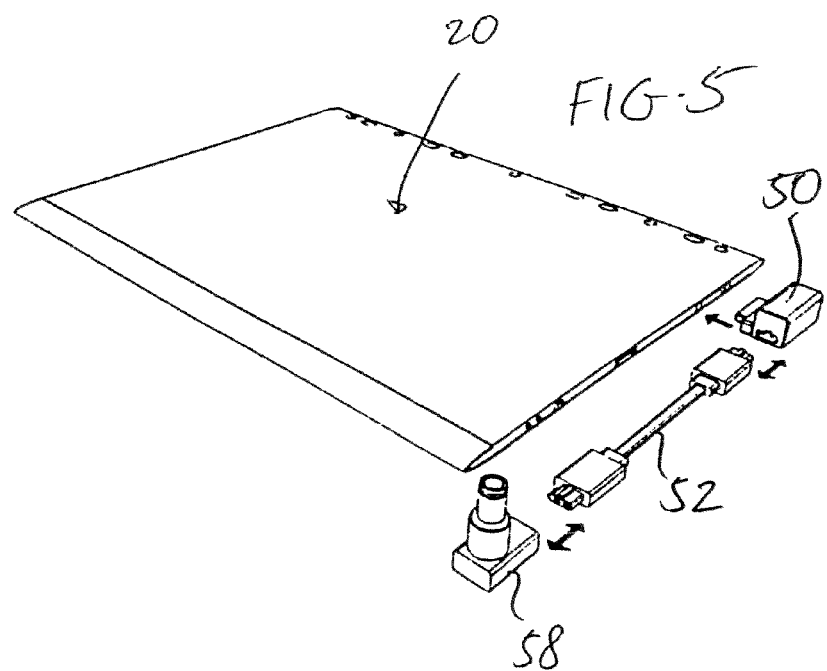
FIG. 5 illustrates how the power supply of FIG. 1 can be used to charge a laptop.

FIG. 5 illustrates how the power supply 20 can be used to charge a laptop. The power supply 20 can be provided with a plurality of power tips 58, each of which is adapted for use with a different type/make of laptop. The user selects the correct power tip 58, and then connects opposite ends of a power cord 52 to the power tip 58 and the power port 50. The power port 50 is then plugged into the power bay 32, and the power tip 58 is plugged into the power inlet of the laptop. Next, the laptop activation switch 36 is turned on, and charging of the laptop begins as power is transferred from the power supply 20 to the laptop. The laptop activation switch 36 can include additional switches to allow for the user to adjust the voltage for the laptop.

Figure 6:
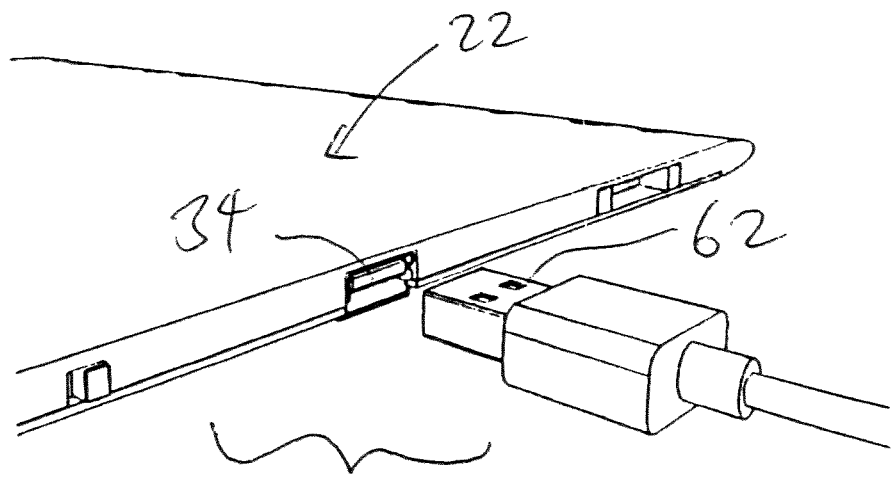
FIG. 6-7 illustrate how the power supply of FIG. 1 can be used to charge a portable device.
Figure 7:
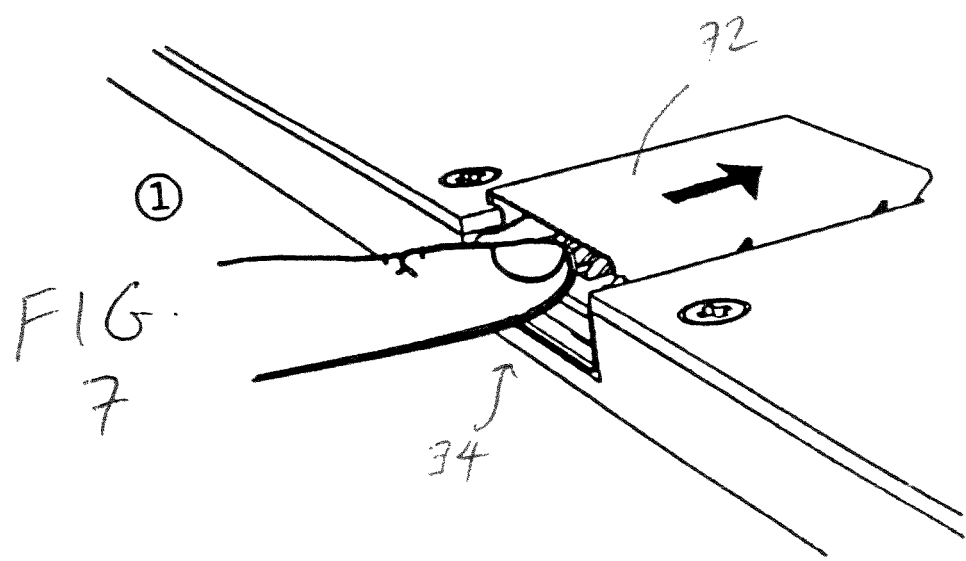

FIG. 6-7 illustrate how the power supply 20 can be used to charge a mobile phone, tablet or other portable device. The plug 62 of a conventional USB cable can be inserted into the USB port 34, and then selection buttons 38 can be activated to begin the charging as power is transferred from the power supply 20 to the portable device. Since the thickness of the housing 22 is thinner than the thickness profile of a conventional USB plug 62, the USB port 34 can be opened and closed. As best shown in FIG. 7 (which is shown with the power supply 20 inverted from the orientation shown in FIG. 1), the USB port 34 has a housing that includes a bottom plate 72 that can be lifted to enlarge the size of the opening for receiving the USB plug 62. The bottom plate 72 can be closed or retracted after charging use so that the thickness profile of the housing 22 can be reduced.

Figure 8A:
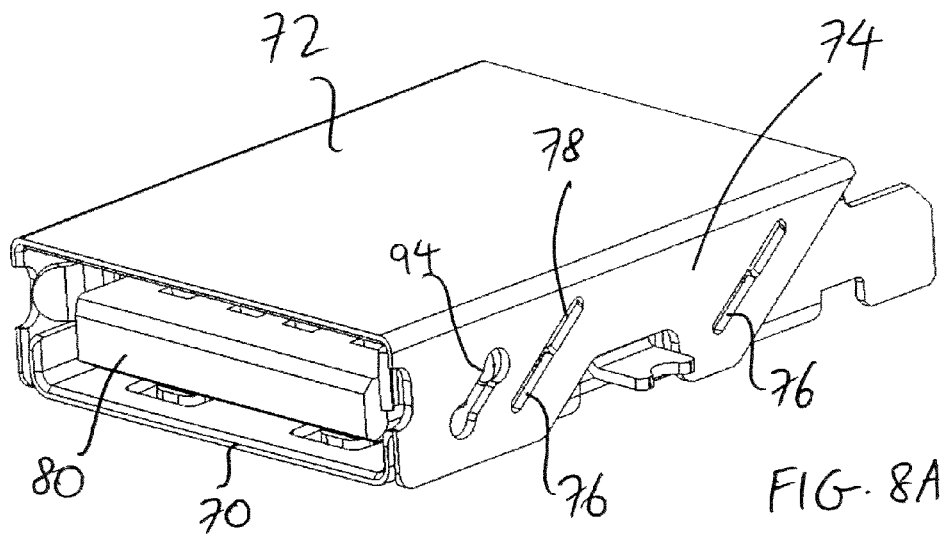
FIG. 8A is a perspective view of the USB port for the power supply of FIG. 1 shown in a closed position.
Figure 8B:
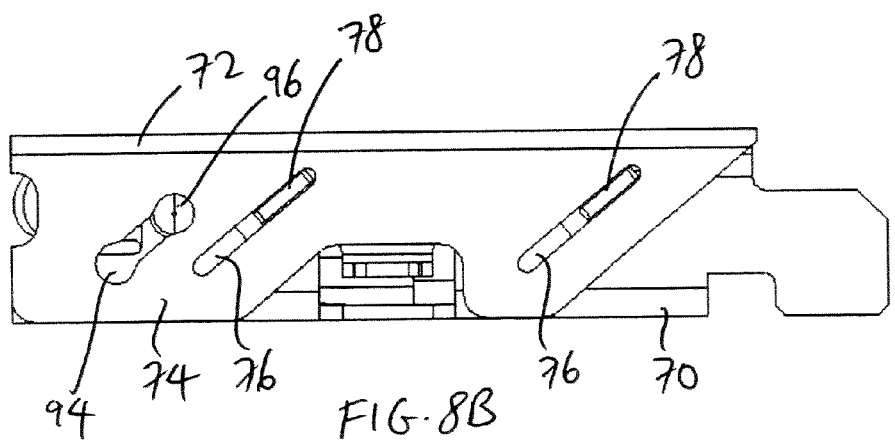
FIG. 8B is a side plan view of the USB port for the power supply of FIG. 1 shown in a closed position.
Figure 9A:
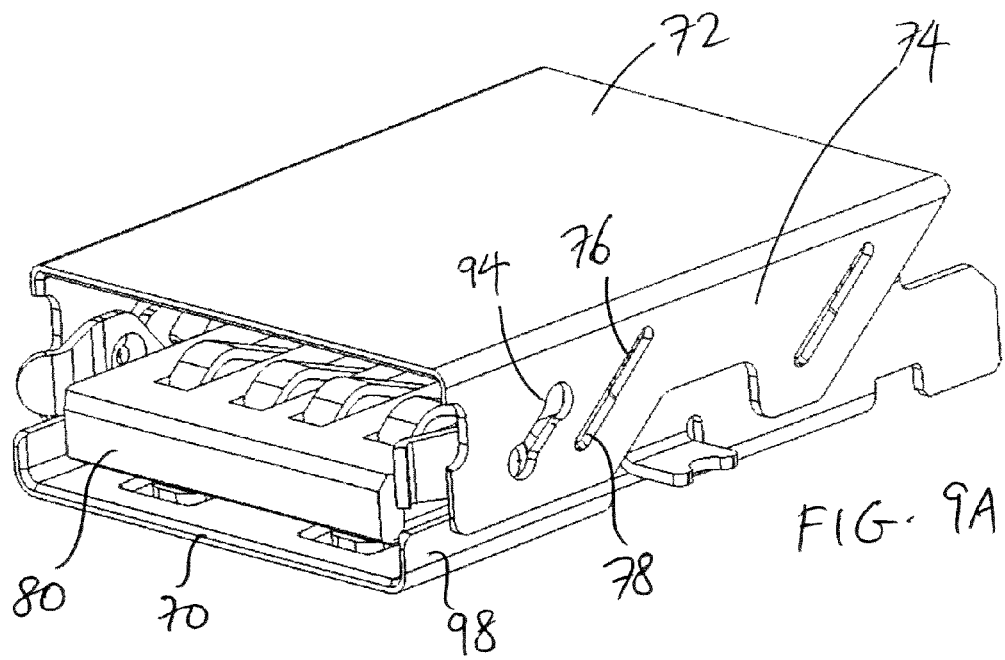
FIG. 9A is a perspective view of the USB port for the power supply of FIG. 1 shown in an opened position.
Figure 9B:
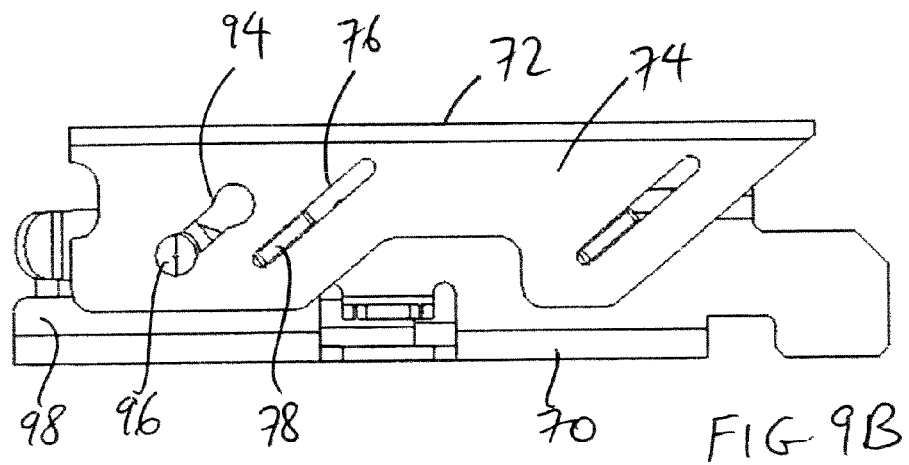
FIG. 9B is a side plan view of the USB port for the power supply of FIG. 1 shown in an opened position.

FIGS. 8A, 8B, 9A and 9B illustrate the USB port 34 in greater detail. FIGS. 8A and 8B show the USB port 34 in its closed or retracted orientation, and FIGS. 9A and 9B how the USB port 34 in its raised or opened position. The housing of the USB port 34 includes a top plate 70, and a bottom plate 72 that can be moved with respect to the top plate 70. Two sidewalls 74 extend from the bottom plate 72, and at least two angled elongated slots 76 are provided in parallel, and spaced apart, along each sidewall 74. A figure-8 pin-hole 94 is also provided along one sidewall 74, and a pin having an enlarged head 96 is seated in one of the ends of the pin-hole 94. The pin with enlarged head 96 extends from a sidewall 98 that extends vertically from the top plate 70. In addition, a pin 78 extends from the sidewall 98 of the top plate 70 into each separate slot 76, so that each pin 78 essentially rides within the slot 76. When the USB port 34 is closed, the pins 78 will be seated adjacent the bottom plate 72 at the ends of the slots 76 closest to the bottom plate 72, and the head 96 will be seated in the end of the pin-hole 94 closest to the bottom plate 72, as best shown in FIGS. 8A and 8B. When the bottom plate 72 is raised or lifted (see FIG. 7), the pins 78 slide to the other end of the corresponding slots 76 so that pins would be seated at the end of the slots 76 furthest from the bottom plate 72, and the head 96 will be seated in the end of the pin-hole 94 furthest from the bottom plate 72, as best shown in FIGS. 9A and 9B. When the bottom plate 72 is lifted, the USB male/female connector 80 is further exposed for coupling with the corresponding female/male connector on the USB plug 62.

Figure 10:
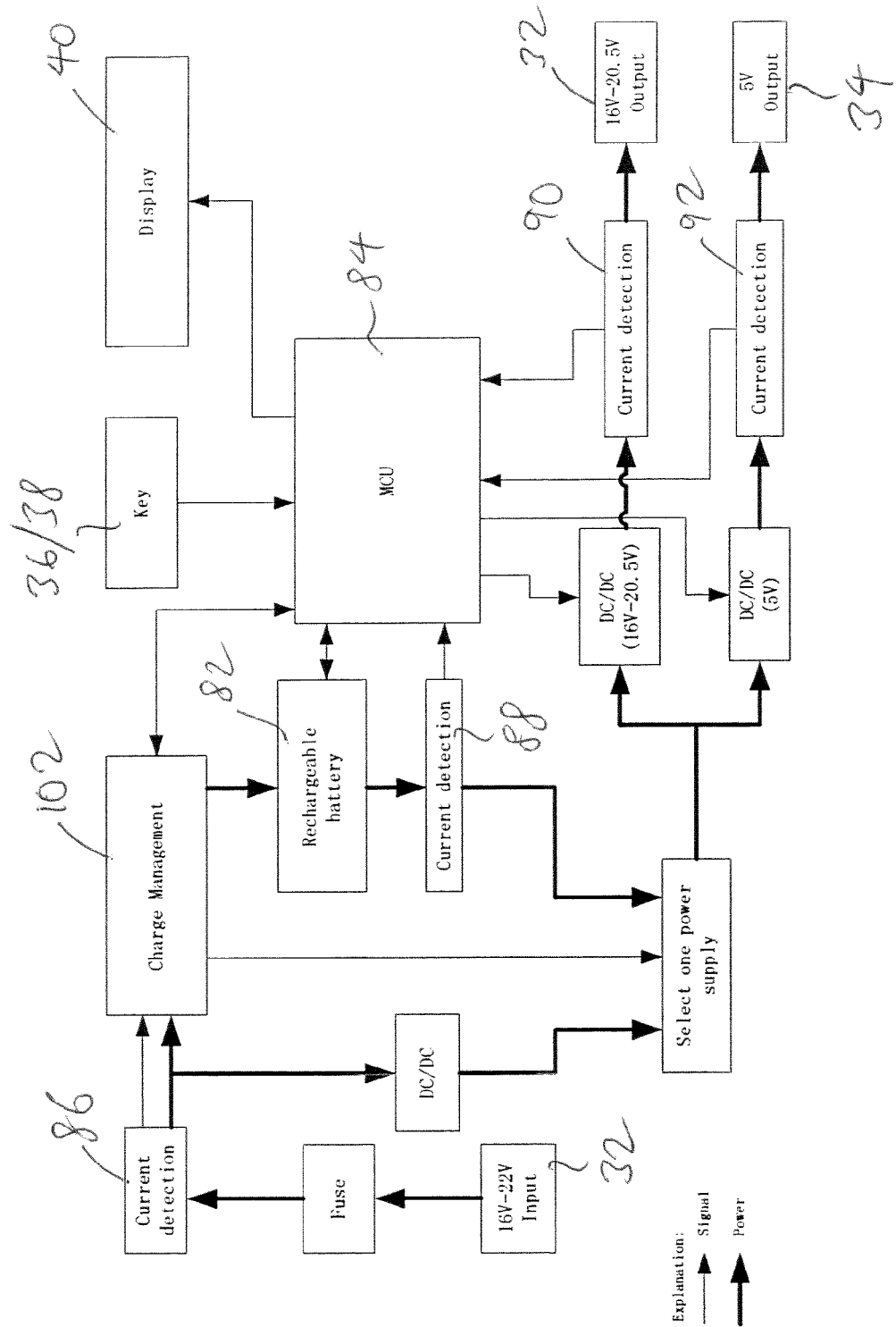
FIG. 10 is a schematic diagram of the electronic circuitry of the power supply of FIG. 1.

FIG. 10 illustrates the electronics inside the power supply 20. The electronics include a rechargeable battery 82 that can be a lithium polymer battery. A processor (MCU) 84 is coupled to the battery 82 and the display 40. The "key" block actually corresponds to the switch 36 and the buttons 38, where the user can enter inputs into the power supply 20 for control purposes, and the "key" block is directly coupled to the MCU 84. The 16V-22V input and 16V-20.5V output correspond to the power hay 32, and the 5V output corresponds to the USB port 34.

A charge management circuit 102 is directly coupled to the MCU 84 for automatically adjust the battery recharge current when backside sink current is large. The balance current will be charged to the level of the battery 82. A first current detection circuit 86 is coupled between the 16V-22V input block and the charge management circuit 102 to detect if there is a high current input that might damage the entire system, so it performs a protective operation before the fuse operation. A second current detection circuit 88 is coupled directly to the battery 82 to detect if there is a high current sink from the backside, and therefore performs a protective operation before the protective latch up of the battery 82 itself. Third and fourth current detection circuits 90 and 92 are coupled to the outputs (5V and 16V-20.5V) and the MCU 84 to detect if the backside sink current is over the current limit.

Thus, when compared with the existing power supplies in the market, the power supply 20 according to the present invention enjoys numerous benefits. It is convenient to carry around as it is compatible with a great majority of the existing notebooks or folders of various sizes, so that it can be stored or retained inside the folder or notebook and carried with other documents and papers.

While the description above refers to particular embodiments of the present invention, it will be understood that many modifications may be made without departing from the spirit thereof. The accompanying claims are intended to cover such modifications as would fall within the true scope and spirit of the present invention.

What is claimed is:

1. A computer peripheral device having a housing, the housing having a USB port that is from a closed position, where it has a first height, to an opened position, where it has a second height greater than the first height, the USB port comprising a top plate, and a bottom plate that is moveable with respect to the top plate so that the USB port can be moved between the opened and closed positions, wherein two sidewalls extend from the bottom plate, each sidewall having at least two angled elongated slots are provided in parallel, and spaced apart, with a pin extending from the top plate into each separate slot, so that each pin rides within the slot between opposite ends of the slot, and further including a locking slot that is provided along one of the sidewalls, and a locking pin that extends from the top plate into the locking slot, the locking pin moveable between opposing ends of the locking slot to secure the USB port in the opened position.

2. The device of claim 1, wherein the locking slot has a locking hole at one end thereof, the locking pin having a head that is seated in the locking hole when the USB port is in the opened.

\* \* \* \* \*